United States Patent
Domeij

(10) Patent No.: US 9,590,047 B2
(45) Date of Patent: Mar. 7, 2017

(54) SIC BIPOLAR JUNCTION TRANSISTOR WITH REDUCED CARRIER LIFETIME IN COLLECTOR AND A DEFECT TERMINATION LAYER

(75) Inventor: Martin Domeij, Sollentuna (SE)

(73) Assignee: FAIRCHILD SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 14/388,585

(22) PCT Filed: Apr. 4, 2012

(86) PCT No.: PCT/EP2012/056215
§ 371 (c)(1),
(2), (4) Date: Sep. 26, 2014

(87) PCT Pub. No.: WO2013/149661
PCT Pub. Date: Oct. 10, 2013

(65) Prior Publication Data
US 2015/0115283 A1    Apr. 30, 2015

(51) Int. Cl.
*H01L 29/16* (2006.01)
*H01L 21/263* (2006.01)
(Continued)

(52) U.S. Cl.
CPC ........ *H01L 29/1608* (2013.01); *H01L 21/263* (2013.01); *H01L 29/0607* (2013.01);
(Continued)

(58) Field of Classification Search
CPC ........... H01L 29/1608; H01L 29/66068; H01L 29/1602; H01L 29/7802; H01L 29/6606
See application file for complete search history.

(56) References Cited

U.S. PATENT DOCUMENTS 5,541,122 A * 7/1996 Tu ................. H01L 29/7395
148/DIG. 126
6,100,575 A * 8/2000 Minato ................. 257/617
(Continued)

FOREIGN PATENT DOCUMENTS

EP    2192211 A1    6/2010
JP    09-121052 A *  2/1996 ............. H01L 29/78

OTHER PUBLICATIONS

International Search Report and Written Opinion for International Application No. PCT/EP2012/056215, mailed Nov. 9, 2012, 11 pages.

*Primary Examiner* — Allen Parker
*Assistant Examiner* — Long Le
(74) *Attorney, Agent, or Firm* — Brake Hughes Bellermann LLP

(57) ABSTRACT

A method of manufacturing a silicon carbide (SiC) bipolar junction transistor (BJT) and a SiC BJT (100) are provided. The SiC BJT comprises an emitter region (150), a base region (140) and a collector region (120). The collector region is arranged on a substrate (110) having an off-axis orientation of about 8 degrees or lower. A defect termination layer (DTL, 130) for terminating dislocations originating from the substrate is arranged between the substrate and the collector region. The collector region includes a zone (125) in which the life time of the minority charge carriers is shorter than in the base region. The present invention is advantageous in terms of improved stability of the SiC BJTs.

23 Claims, 4 Drawing Sheets

(51) Int. Cl.
- *H01L 29/08* (2006.01)
- *H01L 29/66* (2006.01)
- *H01L 29/732* (2006.01)
- *H01L 29/06* (2006.01)
- *H01L 29/32* (2006.01)
- *H01L 29/36* (2006.01)
- H01L 29/04 (2006.01)
- H01L 29/10 (2006.01)

(52) U.S. Cl.
CPC .......... *H01L 29/0821* (2013.01); *H01L 29/32* (2013.01); *H01L 29/36* (2013.01); *H01L 29/66068* (2013.01); *H01L 29/66234* (2013.01); *H01L 29/732* (2013.01); *H01L 29/7322* (2013.01); *H01L 29/04* (2013.01); *H01L 29/107* (2013.01)

(56) References Cited

U.S. PATENT DOCUMENTS

| | | |
|---|---|---|
| 6,235,616 B1 | 5/2001 | Itoh |
| 6,274,892 B1 | 8/2001 | Kub et al. |
| 7,345,310 B2 * | 3/2008 | Agarwal ............ H01L 29/1004 257/197 |
| 2007/0032053 A1 * | 2/2007 | Seki ................ H01L 21/02378 438/507 |
| 2009/0047772 A1 * | 2/2009 | Tsuchida ................ C30B 29/36 438/473 |

* cited by examiner

US 9,590,047 B2

SIC BIPOLAR JUNCTION TRANSISTOR WITH REDUCED CARRIER LIFETIME IN COLLECTOR AND A DEFECT TERMINATION LAYER

FIELD OF THE INVENTION

The present invention relates to the field of semiconductor device technology and, in particular, to high power silicon carbide (SiC)-based devices such as SiC bipolar junction transistors. More specifically, the present invention relates to a method of manufacturing a SiC bipolar junction transistor (BJT) and a SiC BJT.

BACKGROUND OF THE INVENTION

Silicon carbide (SiC) bipolar junction transistors (BJTs) are power devices capable of high-temperature operation and having low on-state and switching losses thanks to the high thermal conductivity, high breakdown electric field and high saturated electron drift velocity of SiC.

Silicon carbide is a semiconductor material having a wide bandgap and presenting a high melting point and physical properties (such as hardness) making it a suitable material for operation in harsh environments. These properties, however, may complicate the manufacturing of devices in SiC, at least for some of the processing steps such as e.g. etching. SiC can also form a large number of polytypes making the growth of single crystal substrate and high quality epitaxial layers difficult.

Silicon carbide substrates having an off-axis orientation are used to grow thick epitaxial layers with smooth morphology. There may however be material defects such as basal plane dislocations that may originate from the substrate and grow into the epitaxial layers. In power devices, such as SiC BJTs, the presence of such dislocations may cause degradation of the device's electrical parameters during operation.

Thus, there is a need for providing improved SiC BJTs and improved methods of manufacturing such BJTs that would alleviate at least some of the above-mentioned drawbacks.

SUMMARY OF THE INVENTION

An object of embodiments of the present invention is to alleviate at least some of the above disadvantages and drawbacks and to provide an improved alternative to the above technique.

Generally, it is an object of embodiments of the present invention to provide a high-power semiconductor device, in particular a SiC BJT, with improved long-term stability. Further, it is an object of embodiments of the present invention to provide a method of manufacturing a SiC BJT that reduces degradation of the device under operation.

These and other objects are achieved by means of a method and a SiC BJT as defined in the independent claims. Preferred embodiments are defined in the dependent claims.

According to a first aspect, there is provided a silicon carbide (SiC) bipolar junction transistor (BJT). The SiC BJT comprises an emitter region, a base region and a collector region. The collector region is arranged on a substrate having an off-axis orientation of about 8 degrees or lower and a defect termination layer (DTL) for terminating dislocations originating from the substrate is arranged between the substrate and the collector region. The collector region includes a zone in which the lifetime of the minority charge carriers is shorter than in the base region.

According to a second aspect, a semiconductor device is provided. The semiconductor device comprises a first region, a second region, a third region and a buffer layer. The first region is disposed on a substrate and has a first conductivity type. The second region is disposed on the first region and has a second conductivity type opposite to the first conductivity type. The third region is disposed on the second region and has the first conductivity type. The buffer layer is disposed between the substrate and the first region for terminating dislocations originating from the substrate. Further, the first region comprises a zone in which a lifetime of minority charge carriers is shorter than in the second region.

According to a third aspect, there is provided a method of manufacturing a BJT in SiC. The method comprises the step of forming a defect termination layer (DTL) on a substrate having an off-axis orientation of about 8 degrees or lower, the DTL being adapted to terminate dislocations originating from the substrate. Further, the method comprises the steps of forming a collector region on the DTL, forming a base region on the collector region, forming an emitter region on the base region and forming, in the collector region, a zone in which the lifetime of minority charge carriers is shorter than in the base region.

Basal plane dislocations may affect the performance of SiC power devices (such as BJTs) and, in particular, accelerate their degradation. Stability is one of the main issues for SiC-based bipolar power devices.

A BPD is a defect in SiC substrate material, as well as in epitaxial layers. Commercially produced epitaxial structures in SiC are grown on off-oriented substrates, i.e. on substrates that are cut out from the single crystal ingot at a certain angle from the basal hexagonal plane. A BPD may continue from the substrate into the epitaxial layers of the power device. Bipolar degradation in SiC may result from the growth of stacking faults (SFs) that is induced by minority carrier injection and recombination in the device. The SFs may originate from basal plane dislocations (BPDs) as a result of BPD splitting into Shockley partials. In case of BPD splitting, one of the partials remains bound to the location of the BPD whereas the other partial may travel tens or even hundreds of microns in the device as long as minority carriers are provided to the leading edge of the partial. The glide of a partial dislocation may occur within the basal (0001) crystal plane. The (0001) plane portion between the two partials will then represent a stacking fault.

The stacking faults may then form resistive barriers for current flow in the device and create channels for fast minority carrier recombination which can reduce the current gain of a SiC BJT. The growth of stacking faults therefore suppresses vertical transport of minority carriers in the device and increases the on-state forward voltage drop. In BJTs, stacking faults also degrade the performance. In particular, the growth of SFs increases the on-state resistance and decreases the common emitter current gain. Thus, there is a need to provide high-power devices that are free (or at least with a reduced number) of BPDs at least in the active parts or regions of the devices, i.e. at least in those parts of the device that are subject to minority carrier injection.

The defect termination layer arranged between the substrate and the collector region is advantageous in that it terminates basal plane dislocations (that otherwise act as seeds for the growth of stacking faults) originating from the substrate such that they do not reach the active regions of the BJT, such as the collector region, the base region and the emitter region.

Further, the zone of the collector region having a lifetime for minority charge carriers lower than in the base region (also referred to as the zone of reduced minority carrier lifetime in the following) is advantageous in that it can prevent access of minority charge carriers to the DTL, thereby preventing the growth of defects, in particular stacking faults (SFs), in the course of device operation. The zone of reduced minority carrier lifetime (also referred to as the minority carrier lifetime or recombination carrier lifetime in the following) is advantageous in that the recombination of carriers in the collector region is enhanced, thereby reducing, and preferably avoiding, the risk that minority carriers diffuse to the DTL in which BPDs are terminated.

The recombination carrier lifetime may advantageously be reduced to a value such that the diffusion length of the minority charge carriers in the zone of reduced minority carrier lifetime becomes significantly shorter than the thickness of such zone. In the following, a numerical example is provided to illustrate the benefit and the efficiency of embodiments disclosed in this specification.

The minority carrier diffusion length $L_P$ can be expressed as $L_p = \sqrt{D_p \times \tau_p}$, where $D_P$ is the minority carrier diffusion coefficient and $\tau_p$ is the minority carrier lifetime. Assuming a minority carrier lifetime $\tau_p$ of 1 μs and a room temperature minority carrier (hole) diffusion coefficient $D_p$ of 3 cm$^2$/s in the collector region of a SiC BJT, as can be the case with state-of-the-art SiC epitaxy of lowly doped n-type material, the minority carrier diffusion length $L_p$ is then equal to about 17 μm, which is significantly larger than a typical collector thickness for a SiC BJT with 1200 V rating. Such a SiC BJT would then be subject to potential bipolar degradation. Assuming now that the minority carrier lifetime is reduced in the whole collector region (making it a region of reduced minority carrier lifetime) to a value of 1 ns, then the minority carrier diffusion length becomes about 0.5 μm only, which is less than 10% of the collector thickness in a SiC BJT with 1200 V rating. The present example shows that a reduction of the minority carrier lifetime from 1 μs to 1 ns in the collector region is very efficient for reducing the amount of minority carriers which can diffuse into the defect termination layer.

The present invention is advantageous in that it enables the manufacturing of a SiC BJT with an eliminated or greatly reduced risk for formation of stacking faults in the collector region of the BJT, thereby increasing the long-term stability of the BJT.

The present invention is advantageous in that large area devices with improved stability can be manufactured since bipolar degradation of the BJT under operation is prevented or at least since the probability of observing bipolar degradation is much reduced. On the one hand, with the DTL, propagation of BPDs from the substrate to the collector region is prevented and, on the other hand, with the reduced minority carrier lifetime in the collector region, undesired growth of SFs under minority carrier injection conditions (even in large-area bipolar devices) is prevented.

The present invention is advantageous in that it provides a more stable SiC BJT on a substantially flat substrate, at least without deteriorating the layer morphology of the device (BJT). The present invention facilitates therefore any subsequent step in the processing of the SiC BJT.

It will be appreciated that the step of forming the zone of reduced minority carrier lifetime (or having a minority carrier lifetime lower than that of the base region) may be performed after or before forming the base region and the emitter region on top of the collector region. However, forming the zone after forming the base region and the emitter region is advantageous in that the process, such as e.g. epitaxial growth, used for forming the collector region, the base region and the emitter region does not have to be interrupted, thereby resulting in a more effective process in terms of time and cost.

According to an embodiment, the substrate may have an off-axis orientation of about 2 to 4 degrees, which is advantageous in that, on the one hand, an off-axis of about (or at least) 2 degrees reduces the bunching of surface steps and nucleation of other polytypes during epitaxial growth of SiC and, on the other hand, the off-axis that is not higher than about 4 degrees reduces the BPD density.

According to an embodiment, the DTL may have a thickness comprised in the range of about 5 to 30 micrometers. The DTL or buffer layer arranged between the substrate and the collector region (or first region, referring to the terminology used for the second aspect) has a thickness suitable for terminating dislocations (BPDs) originating from the substrate (i.e. the dislocations terminate within the DTL) or for converting the dislocations into less catastrophic defects such as e.g. threading edge dislocations.

Thanks to the zone of reduced minority carrier lifetime in the collector region, the requirements on the thickness of the DTL are relaxed (requiring only that the thickness of the DTL is suitable for terminating the BPDs, independently of the diffusion length of minority charge carriers in the DTL), which is advantageous in that the DTL can be made thinner, thereby reducing the constraints on time and costs associated with epitaxial growth. Reducing the need of growing thick buffer layers is also advantageous as thick layers can result in layers of lower crystal quality and with worse surface morphology. The invention is advantageous in that the performance of the resulting device is less dependent of material quality.

The emitter region, the base region, the DTL, and the collector region may be arranged as a stack in order to form a vertical BJT. In particular, the SiC BJT may be a vertical BJT including for example an n-type collector region, a p-type base region and an n-type emitter region.

According to an embodiment, the zone may extend laterally at least under the metallurgical junction formed by the base region and the emitter region, which is advantageous in that minority carrier injection in the device occurs primarily at the pn junction formed by the base region and the emitter region.

According to an embodiment, the zone may cover at least 10 percent of the volume or thickness of the collector region (see above numerical example), such as at least 50 percent and even more preferably such as at least 80 percent.

According to an embodiment, the zone may extend vertically towards the DTL, starting at a distance of about 1-4 μm (micrometers) from the metallurgical junction formed by the base region and the collector region. As will be further explained in the following, the manufacturing technique employed for forming the zone of reduced minority carrier lifetime in the collector region may create defects, damaging the crystallographic structure of the material. Forming the zone of reduced minority carrier lifetime at a certain distance from the metallurgical junction between the base region and the collector region is advantageous in that the risk of creation of defects in, and/or of propagation of defects to, such a junction is reduced.

According to an embodiment, the zone may be arranged at least in a lower part of the collector region, preferably in proximity of an interface between the collector region and the DTL. The present embodiment is also advantageous in that the risk of creation of defects in, and/or of propagation of defects to, the metallurgical junction formed by the base region and the collector region is reduced since the zone is arranged away from such a junction. In addition, the present embodiment is advantageous in that the zone is arranged in proximity of the interface between the collector region and the DTL. It is preferable that the zone extends towards such an interface in order to further reduce the probability of providing minority carriers to the BPDs terminated in the DTL, thereby reducing the risk of nucleation of SFs from such terminated BPDs.

According to an embodiment, the zone may extend vertically through the whole collector region. In the present embodiment, the zone may extend in the collector region, all the way from the border of the base region (i.e. the metallurgical junction or interface between the base region and the collector region) to the border of the DTL (i.e. the interface between the collector region and the DTL). For example, the zone may occupy 100% of the volume of the collector region. However, it may also be sufficient if the zone extends through the whole collector under (at least a major part of) the metallurgical junction between the base region and the collector region. Such a design is advantageous in that the formation of the zone in the device may not need any specific control as the whole collector region can be treated similarly. In the present embodiment, the whole collector region has a reduced or low (at least lower than in the base region) minority carrier lifetime, thereby enhancing recombination, which is advantageous in that bipolar degradation is even more effectively prevented in the BJT.

According to an embodiment, the lifetime of the minority charge carriers in the DTL may be shorter than in the base region, and preferably also shorter than in the emitter region (in particular if the doping level of the DTL is high). In other words, the zone of reduced minority carrier lifetime may extend in the DTL. In the present embodiment, the risk of bipolar degradation is even further reduced in that the DTL has a double function, i.e. it is configured to terminate basal plane dislocations and also prevent diffusion of minority carriers, thereby reducing the risk of SFs nucleation from the BPDs terminated in the DTL. The present embodiment is also advantageous in that the technique employed for forming the zone of reduced minority carrier lifetime does not need to exactly stop at the interface between the collector region and the DTL.

According to an embodiment, the lifetime of the minority charge carriers in the zone, and optionally in the DTL, may be less than about 200 nanoseconds, such as less than 10 nanoseconds. In contrast, for traditional BJTs, the minority carrier lifetime in the collector region is longer than in the base region and may probably reach value up to, and even higher than, 1 microsecond.

According to an embodiment, the minority carrier lifetime in the zone, and optionally in the DTL, may be twice less, and preferably at least three times less, than in the base region.

According to an embodiment, the doping level in the collector region may be uniform. In particular, the doping level and doping profile in the zone may be the same as in the remaining part of the collector region. No specific processing to alter the doping level of the zone is necessary and the zone is a part of at least the collector region.

According to an embodiment, the zone (of the collector region), and optionally the DTL, may have a damaged crystallographic structure. In particular, the zone may be an ion-bombarded zone or an electron-irradiated zone.

According to a first alternative, the step of forming the zone may therefore include ion bombardment of a zone of the collector region. The step of ion bombardment may be performed after or before forming the base region and the emitter region on the collector region.

Should the ion-bombarded zone be formed in the collector region after the formation of the base region and the emitter region, the base region and/or the emitter region may advantageously have a lower concentration of carbon (C) vacancies than the collector region since carbon-enriched regions of the device suffer much less from damage caused by ion bombardment. The manufacturing of the device may therefore advantageously include a processing step for enriching the base region and/or the emitter region with carbon. For example, the manufacturing method may include a step of carbon implantation in the base region and/or the emitter region. A step of annealing subsequent to the carbon implantation may be performed in order to cause Carbon atoms to diffuse to a controlled depth below the surface such that the minority carrier lifetime in the emitter region and in the base region is increased. According to another example, the manufacturing method may include oxidation of a surface of the base region and/or a surface of the emitter region. Such an oxidation results in an emitter region and a base region having a Carbon-enriched surface since oxidation consumes mainly silicon (Si) atoms to form an oxide ($SiO_2$) and leaves an excess of Carbon atoms at the $SiC/SiO_2$ interface and in the $SiO_2$ layer.

According to a second alternative, the manufacturing method may include electron irradiation of a zone of the collector region. Although electron irradiation may in principle be performed for at least a zone of the collector layer after epitaxy of the whole BJT structure (i.e. after forming the DTL, the collector layer, the base layer and the emitter layer) using additional techniques to protect the base layer and the emitter layer from electron irradiation, an advantageous manufacturing sequence is to first grow the DTL and the collector layer and then perform electron irradiation since electron irradiation as such results in irradiation of the entire collector region (and optionally also the DTL). The manufacturing sequence may then include growth of the base and emitter layers for subsequently defining the emitter region, base region and collector region in these layers (using e.g. a sequence of photolithography and etching techniques). With such a manufacturing sequence of epitaxy and electron irradiation, a region with low minority carrier lifetime in the collector region (preferably the whole collector region), and optionally also in the DTL, is obtained (at least a minority carrier lifetime being shorter than in the base region) while a high (or at least higher) minority carrier lifetime is maintained in the base and emitter layers since these layers are grown after electron irradiation. A higher minority carrier lifetime maintained in the base and emitter regions is advantageous in that a high current gain can be obtained even with a reduced minority carrier lifetime in the collector region and the DTL.

According to an embodiment, the method comprises epitaxial growth of at least a portion of the collector region (or layer) with a first set of growth parameters and epitaxial growth of the base region (or layer) with a second set of growth parameters for obtaining a minority carrier lifetime in said portion of the collector region being shorter than in said base region. The present embodiment is advantageous in that a minority carrier lifetime shorter in a portion (or zone) of the collector region than in the base region is directly obtained after the epitaxial growth of the layers forming the collector, the base and the emitter of the BJT, thereby not necessitating any additional (probably subsequent) step for forming the zone of reduced minority carrier lifetime. In the present embodiment, the step of forming the zone with reduced minority carrier lifetime is incorporated in the normal manufacturing process of the BJT. In this case, the recombination lifetime (or lifetime of minority carriers in the zone) is controlled by the parameters of the epitaxial growth. According to the present embodiment, the switch between epitaxial parameters providing a short(er) minority carrier lifetime to epitaxial parameters providing a high(er) minority carrier lifetime occurs at least at the interface between the collector region and the base region. The whole collector region may have a reduced minority carrier lifetime. It may also be envisaged that the switch occurs before the interface between the collector region and the base region (e.g. some 1-4 micrometers from the metallurgical junction between the collector region and the base region). As another example, the step of forming the zone may include epitaxial growth with a first set of growth parameters for forming a first part of the collector region, epitaxial growth with a second set of growth parameters being different than the first set of growth parameters for forming the zone and epitaxial growth with the first set of growth parameters for forming the remaining part of the collector region. An example of growth parameters influencing the minority carrier lifetime is the relationship between the gas flows of the precursors, and in particular the ratio between Carbon and Silicon or the ratio between the precursors providing the Carbon atoms and the Silicon atoms, such as e.g. silane and propane. It may also be envisaged to vary the precursors, e.g. switching from a first type of precursor to a second type of precursor for the Carbon atoms (or for the Silicon atoms) at the interface between the collector layer and the base layer, thereby influencing the growth conditions and the resulting minority carrier lifetime in these layers.

Referring to the terminology according to the second aspect, the first region may be the collector, the second region may be the base and the third region may be the emitter of a bipolar junction transistor. It will be appreciated that the features of any of the embodiments described above with reference to the first aspect may be combined with the semiconductor device according to the second aspect and the method of manufacturing in accordance with the third aspect.

Further objectives of, features of, and advantages with, the present invention will become apparent when studying the following detailed disclosure, the drawings and the appended claims. Those skilled in the art will realize that different features of the present invention can be combined to create embodiments other than those described in the following.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, in which.

All the figures are schematic, not necessarily to scale, and generally only show parts which are necessary in order to elucidate the invention, wherein other parts may be omitted or merely suggested.

DETAILED DESCRIPTION

Figure 1:
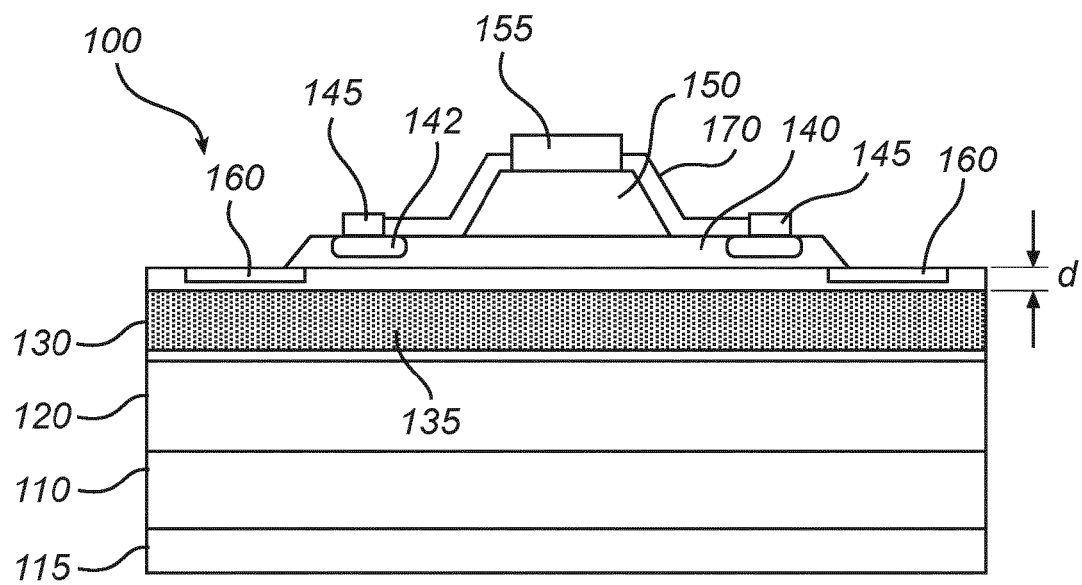
FIG. 1 shows a schematic view of SiC BJT comprising a collector layer, a base layer and an emitter layer in accordance with an exemplifying embodiment of the present invention.

With reference to FIG. 1, there is shown a schematic view of a SiC BJT in accordance with an exemplifying embodiment of the present invention.

FIG. 1 shows a semiconductor device, in particular a SiC BJT 100, comprising a substrate 110, a defect termination layer (DTL) or buffer layer 120 and a first region or collector region 130. The first region or collector region 130 is made of a first conductivity type, e.g. n-type (wherein electrons are the majority carriers). The DTL 120 is arranged between the substrate 110 and the first region or collector region 130. In the embodiment described with reference to FIG. 1, the SiC BJT 100 further comprises a base region or second region 140 of semiconductor (SiC) being of a conductivity type opposite to the first type, i.e. p-type in the present example. The device 100 comprises also an emitter region 150 of semiconductor (SiC) being of the first conductivity type, i.e. the same conductivity type as the first region or collector region 130. The emitter region 150, the base region 140 and the collector region 130 of the BJT 100 are arranged as a stack of layers on top of the buffer layer or DTL 120 disposed on the substrate 110. For example, the substrate 110 may be a highly doped n-type semiconductor substrate, the collector region 130 may be a low-doped n-type semiconductor, the base region 140 may be a p-type semiconductor and the emitter region 160 may be a highly doped n-type semiconductor.

The long term stability of the SiC BJT 100 is improved by providing (or forming) a DTL 120 between the substrate 110 and the collector region 130. In particular, the thickness of the DTL 120 is adjusted for terminating BPDs (i.e. the BPDs ends within the DTL 120) and may be in the range of about 5 to 30 micrometers (µm).

Using a DTL, the BPD density is decreased from the substrate 110 to the DTL 120 because of a change of the dislocation line direction from in-plane to almost normal to the basal plane. Threading edge dislocation (TEDs) may form from the BPDs within the DTL, which is advantageous in that TEDs are not as harmful to device stability as BPDs since TEDs generally do not split into partials and do not produce stacking faults.

For a substrate having a large off-axis orientation or angle (such as 8 degrees or above), the BPD-to-TED conversion occurs at the substrate-to-layer interface (i.e. at the interface between the substrate 110 and the DTL 120) and the probability for conversion within the epitaxial layer 120 may be very low even if the DTL 120 would be tens of microns thick. Thus, it is advantageous if the off-axis orientation of the substrate is lower than 8 degrees and, in particular, if it is substantially close to 4 degrees or lower, such as e.g. about 2-4 degrees.

According to an embodiment, the SiC BJT 100 may be a vertical npn-type BJT, the term "vertical" referring to the direction of epitaxial growth of the layers on the substrate 110. The BJT 100 may for example be formed on a 4H—SiC substrate with a low off-orientation angle of approximately 4 degrees or lower (i.e. less than or equal to approximately 4 degrees). The epitaxial stack may comprise at least four layers sequentially grown onto the substrate 110: a DTL 120, a low-doped n-type collector or collector region 130, a p-type base or base region 140 and a heavily doped n-type emitter or emitter region 150. In the example shown in FIG. 1, the NPN BJT is a vertical BJT wherein a mesa (or elevated structure) comprising the emitter 150 has been formed (e.g. via etching).

The BJT may also be provided with ohmic emitter, base and collector contacts 115, 145 and 155 for the collector 130, the base 140 and the emitter 150, respectively, as well as with peripheral junction termination regions 160 to prevent from early breakdown over the outer device periphery. A dielectric surface recombination suppression (SRS) layer 170 may also be formed at and around the sidewall (i.e. the periphery) of the emitter mesa 150 to suppress excessive surface recombination and to avoid, or at least reduce, surface-related gain instability. The SRS layer may be deposited both on top and around the emitter region (or mesa) 150 as shown in FIG. 1. Further, the SRS layer 170 may advantageously extend laterally (by a certain distance) over the surface of the passive base region (which corresponds to the portion of the base region 140 that is laterally spaced from the emitter mesa 150, i.e. the portion of the base region 140 not interfacing the emitter region 150). In particular, the lateral extension of the SRS layer 170 over the passive base region may be greater than three times the base thickness as measured from the metallurgical base-to-emitter p-n junction. The material of the SRS layer 170 may be selected from the group including silicon dioxide, silicon oxinitride, aluminum oxide or aluminum nitride. Alternatively, the SRS layer 170 may comprise a stack including more than one of the dielectric materials of said group. The use of the SRS layer 170 is advantageous in that it further improves the stability of the silicon carbide BJT, in particular for reducing instability caused by carrier recombination at the surface.

In addition, the collector region 130 of the SiC BJT 100 may comprise a zone 135 having a minority carrier lifetime shorter than the minority carrier lifetime in the base region 140. The purpose of the zone 135 of reduced minority carrier lifetime is to block (or at least limit) the access of minority carriers to the BPDs terminated within the DTL 120 such that growth of SFs is prevented.

Minority carriers may be present in the collector region 130 under certain operation modes of the device, such as for example in BJT saturation. If minority carriers are allowed to access the BPDs terminated in the DTL 120, then stacking faults may start propagating along the basal plane and eventually reach the active layers 130, 140 and 150 of the BJT resulting in performance degradation.

It is advantageous if the lifetime of minority charge carriers in the zone 135 of the collector region 130 is much shorter than the lifetime of minority charge carriers in the base region 140. For example, the minority carrier lifetime in the zone 135 may be twice less, and preferably at least three times less, than in the base region 140.

In particular, the lifetime of the minority charge carriers in the zone 135 may preferably be less than about 200 nanoseconds, such as less than 10 nanoseconds. Still, although the minority carrier lifetime can be reduced to much less than 10 nanoseconds, it will be appreciated that the minority carrier lifetime is preferably not indefinitely reduced in order not to form too many defects, which may otherwise lead to a crystallographic structure with dopant atoms displaced from their regular lattice sites or forming defect complexes resulting in dopant deactivation.

Optionally, in order to further reduce or prevent the access of minority carriers to BPDs terminated in the buffer layer 120, the doping level (of e.g. Nitrogen) in the buffer layer may be comprised in the range of $3\times10^{18}$ to $2\times10^{19}$ cm$^{-3}$, and more preferably in the range of $5\times10^{18}$ to $1\times10^{19}$ cm$^{-3}$. Higher levels of Nitrogen doping may tend to generate new defects within the DTL such as e.g. 3C polytype inclusions and in-grown stacking faults. The doping level of the DTL is therefore preferably limited.

Although the zone 135 of the collector region 130 shown in FIG. 1 extends laterally in the entire width of the collector region 130, the zone 135 may extend laterally at least under the metallurgical junction formed by the base region 140 and the emitter region 150, i.e. at least under the active (or intrinsic) part of the base region 140 (i.e. under the part of the base region 140 capped by the emitter region 150 or in other words at least under the outline of the emitter mesa as defined by its sidewalls). Embodiments wherein the zone 135 extends laterally under both the active (or intrinsic) part and the passive (or extrinsic) part of the base region 140 may also be envisaged, the extrinsic part of the base region 140 being defined as the part or portion of the base region 140 being not capped by the emitter region 150.

In some embodiments, the zone 135 may cover at least 10 percent of the volume of the collector region, such as at least 50 percent and preferably at least 80 percent.

Although in some embodiments the zone 135 may extend within the collector region 130 from the border of the base region 140, i.e. from the interface between the base region 140 and the collector region 130, in other embodiments the zone 135 may extend vertically towards the DTL 120, starting at a distance, denoted as d in FIG. 1, from the metallurgical junction formed by the base region 140 and the collector region 130. The distance d may be in the range of about 1-4 μm and may be advantageous for preventing the creation of defects too close to the base region 140.

As depicted in FIG. 1, in some embodiments, the zone 135 may be arranged at least in a lower part of the collector region or first region 130, preferably in proximity of the interface between the collector region 130 and the DTL 120.

Figure 2:
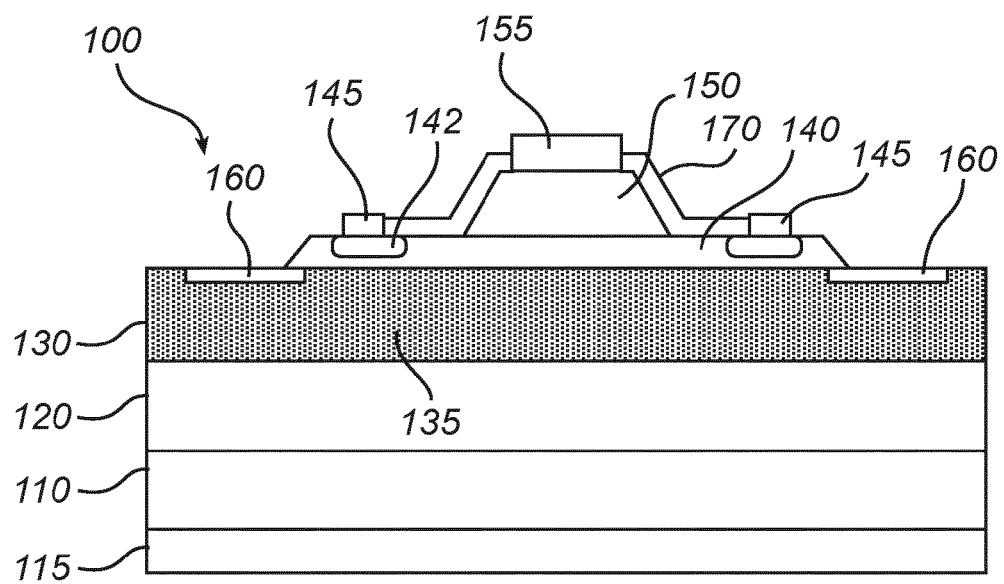
FIG. 2 shows a schematic view of a SiC BJT in accordance with another exemplifying embodiment of the present invention.

With reference to FIG. 2, there is shown a schematic view of a SiC BJT in accordance with another exemplifying embodiment of the present invention.

FIG. 2 shows a semiconductor device, in particular a SiC BJT 200, which is identical to the BJT 100 described above with reference to FIG. 1 except that the zone 235 of reduced minority carrier lifetime extends vertically through the whole collector region. In the embodiment depicted in FIG. 2, the zone 235 extends all the way through the collector region 130, starting at the interface between the base region 140 and the collector region 130 and extending all the way to the interface formed by the collector region 130 and the DTL 120.

Although not shown in FIG. 2, in some embodiments the DTL 120 may also be designed such that the lifetime of the minority charge carriers in the DTL 120 is shorter than in the base region 140. In such embodiments, the zone 135 extends in the DTL and covers both at least part of the collector region 130 and part of the DTL 120, preferably covering the entire collector region 130 (for example 100% of its volume) and the entire DTL 120.

As for the device described with reference to FIG. 1, the SiC BJT 200 comprises a DTL or buffer layer 120 configured to terminate BPDs originating from the substrate 110 and a zone 235 with reduced minority carrier lifetime such that no or at least very few minority carriers are present at the interface between the collector region 130 and the DTL 120, thereby avoiding the growth of stacking faults at the BPDs terminated in the DTL 120. The combination of the DTL 120 and the zone 235 with reduced minority carrier lifetime in the collector region 130 provides an improved long-term stability of the SiC bipolar transistor.

Figure 3A:
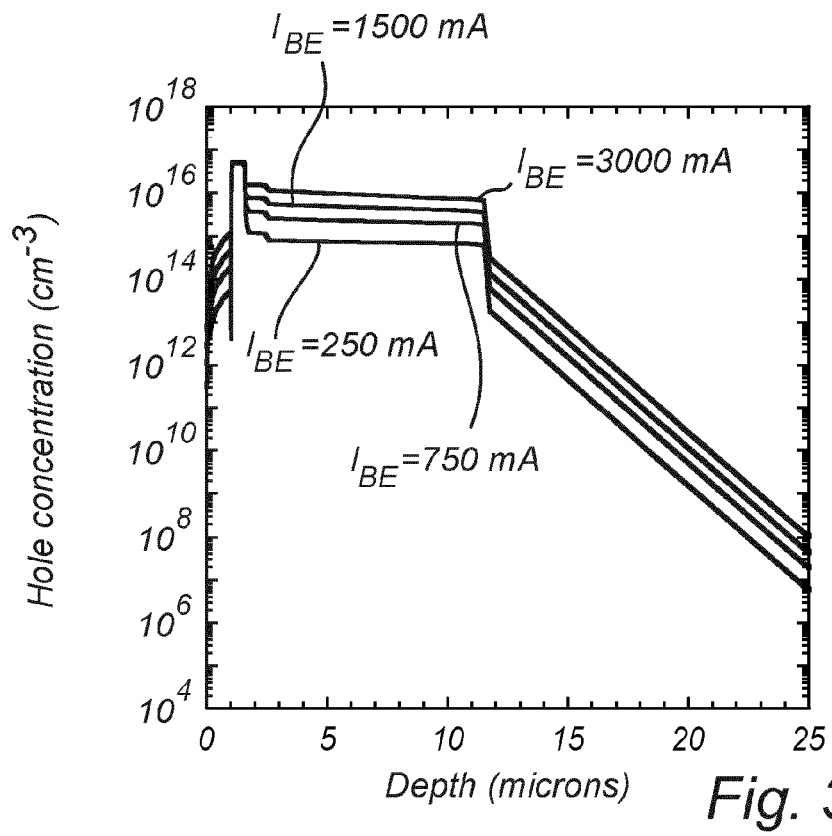
FIGS. 3a and 3b show results from simulations performed for a SiC BJT with a zone of reduced minority carrier lifetime in the DTL only and for a SiC BJT with a zone of reduced minority carrier lifetime in the whole collector region and in the DTL, respectively.
Figure 3B:
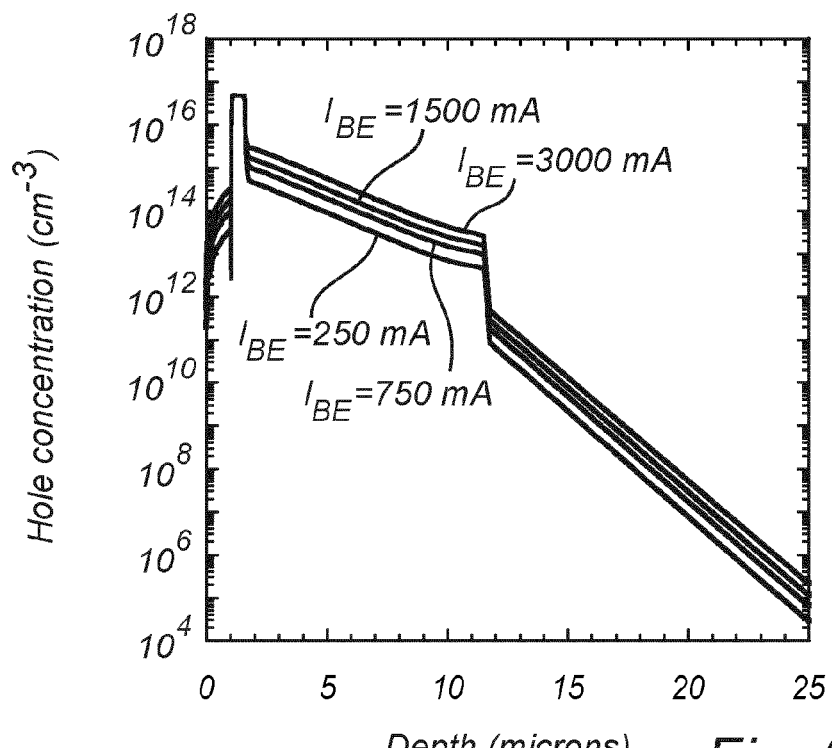

FIGS. 3a and 3b show results from simulations performed for a SiC BJT with a low minority carrier lifetime in the DTL only and for a SiC BJT with a low minority carrier lifetime in the DTL and the whole collector region, respectively.

More specifically, FIGS. 3a and 3b show the hole concentration (concentration of positive charge carriers which are the minority carriers in n-type material such as e.g. in the collector region of a NPN BJT) as a function of depth along the vertical cross-section of a BJT (i.e. from the surface of the BJT to the substrate). In the simulations, the BJT is assumed to have an active area of 5 mm$^2$. FIG. 3a shows the simulation results under DC conditions with a forward-biased base-emitter junction and open collector for a SiC BJT having a minority carrier lifetime of 10 ns in the DTL (at depths greater than 11.6 μm) and 1 μs (microsecond) in the collector region (between 1.6 μm and 11.6 μm) while FIG. 3b shows the simulation result for a SiC BJT having a minority carrier lifetime of 10 ns both in the collector region (between 1.6 μm and 11.6 μm) and in the DTL. The results are shown for different base currents $I_{BE}$, as shown in FIGS. 3a and 3b. These results illustrate the benefit of having a reduced minority carrier lifetime in both the collector region and the DTL. The simulations show that the hole concentration can be reduced by orders of magnitude by minority carrier lifetime reduction in the collector region. As bipolar degradation depends on the recombination of holes (getting trapped in a BPD and thereby initiating a SF) and the probability of recombination depends on the hole concentration, bipolar degradation is reduced as the hole concentration is reduced.

With reference to FIGS. 4a-4c and FIGS. 5a-5c, more detailed but non-limiting methods of manufacturing silicon carbide BJTs will be described in the following.

In some embodiments, the SiC substrate 110 may be a substrate with an off-orientation angle of approximately 4 degrees off the basal (0001) crystal plane. The off-orientation direction may preferably be chosen towards the [11-20] crystal direction since this direction provides an improved layer morphology as compared to other off-orientation directions. However, it will be appreciated that the present invention is not limited to such an off-orientation direction and that other off-orientation directions such as [1-100] may also be employed since there is only a marginal difference in layer quality between different off-orientation directions. Silicon carbide is a polar crystal, i.e. the crystal face properties are dependent on the sign of crystal direction. The [0001] crystal plane may be referred to as the silicon crystal face to distinguish it from the opposite [000-1] carbon face. Silicon crystal face is traditionally preferred for SiC device epitaxy, however the carbon face may also be used. An epitaxy-ready substrate may preferably be used, which means that the substrate may comprise a high quality surface finish provided by an appropriate surface polishing and cleaning. Optionally, additional surface finish routines known in crystal preparation techniques may be applied if the received substrate finish is of insufficient quality. The substrate 110 is preferably a low-resistivity n-type material.

The substrate 110 may then be placed in a Chemical Vapor Deposition (CVD) machine to perform deposition of the epitaxial layers that are required for the desired operation of the BJT. The layer structure of the BJT may generally be formed by sequential deposition of an n-type DTL 120, a lightly doped n-type collector layer 130, a p-type base layer 140 and a heavily doped n-type emitter layer 150. For example, a BJT in SiC may comprise a low-doped collector layer 130 with a thickness of approximately 1 μm per 100 V of the desired blocking voltage. Thus, a blocking range between 600 V and 1.8 kV requires a collector thickness between approximately 5 and 20 micrometers. Further details of the optimization of the parameters of the layers of a BJT are known to persons skilled in the art and are therefore deliberately omitted here. Although the doping level in the collector region may be uniform, it will be appreciated that BJT designs optimized for specific applications might employ non-uniform doping profiles rather than flat doping profiles, in particular for the base, emitter and/or collector regions. The doping profiles may for example be changed either in a graded or in a stepwise manner.

The CVD growth of SiC may be performed at a high temperature of about 1550-1650° C. Substantially higher deposition temperatures may be undesirable for CVD growth of silicon carbide on low off-orientation substrates due to deterioration of the surface morphology (also referred to as step bunching). The step bunching may develop on low off-orientation substrates at high deposition rate. Generally, the CVD growth requires appropriate pump-down and purge of equipment, heat-up in hydrogen ambient to the deposition temperature, pre-epitaxial hydrogen etch for removal of surface contamination and/or damage, and subsequent deposition of desired epitaxial layers using appropriate carbon and silicon precursors under well controlled conditions. The deposition rate is preferably kept substantially low such that precursor oversaturation at the wafer surface does not result in structural defect formation. Nitrogen and aluminum precursors may be introduced in a required amount in order to achieve the desired level of donor or acceptor doping. Silane and propane may be used as silicon and carbon precursors for the growth of SiC. However, other precursors like, for example, chlorosilanes may also be employed for deposition of SiC. Chlorosilanes may for example be introduced into the reaction chamber using silicon tetrachloride instead of silane as silicon precursor, or by using methyltrichlorosilane or by introduction of HCl into the reaction chamber. It will be appreciated that the present specification is not limited to such precursors and that other precursors providing the appropriate process chemistry may be envisaged.

Figure 4A:
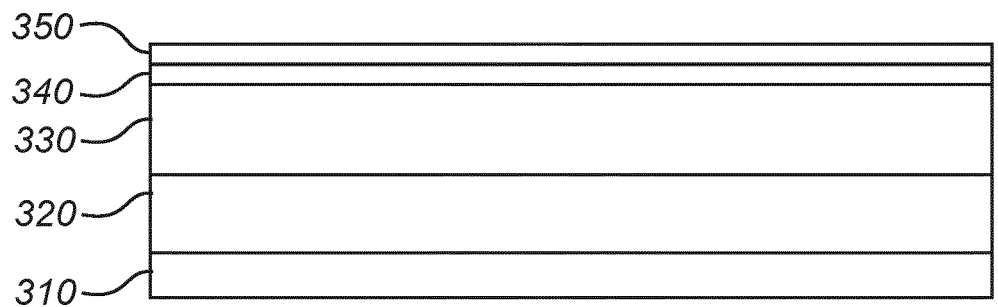
FIGS. 4a-4c illustrate methods of manufacturing a SiC BJT according to embodiments of the present invention.
Figure 4B:
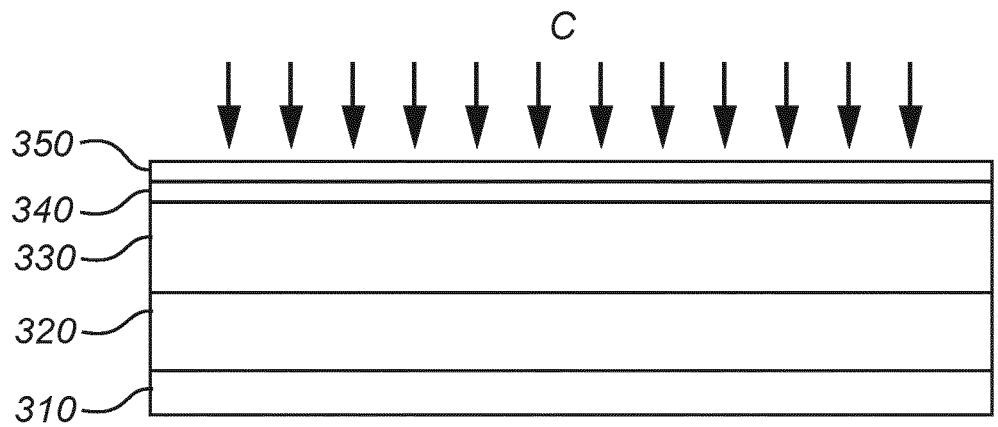
Figure 4C:
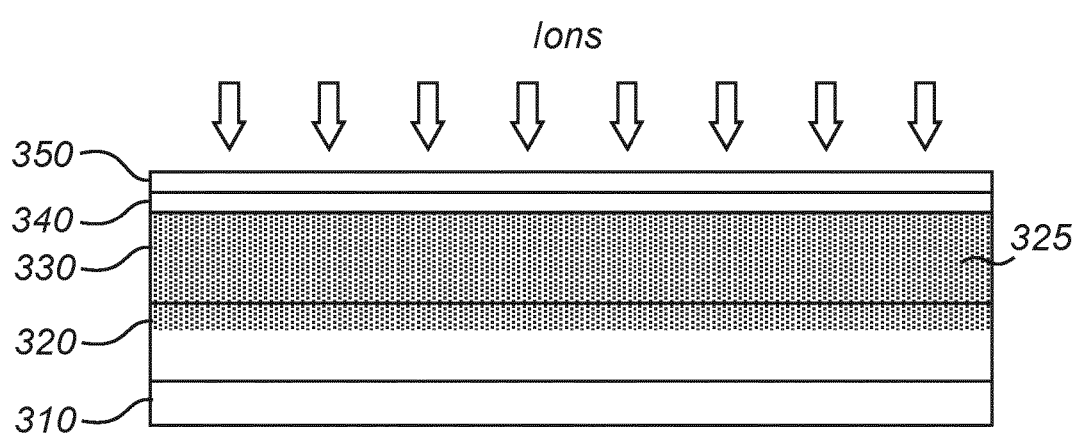

Turning now to FIGS. 4a-4c, a sequence of manufacturing steps for forming a SiC BJT according to an embodiment is described. The present sequence uses ion bombardment to reduce the minority carrier lifetime in at least a zone of the collector layer. In such a sequence, ion bombardment is performed after epitaxy. The purpose of the ion bombardment is to create damage in the zone of the collector region intended to have a reduced minority carrier lifetime. Carbon vacancies may correlate with a defect called $Z_{1/2}$ center (created by ion bombardment), thereby leading to a reduction of the minority carrier lifetime. Damage may however be created in other parts (or layers) of the device, in particular the emitter layer and the base layer, in which it is preferable to have a high minority carrier lifetime. The present sequence provides some remedies for maintaining a high minority carrier lifetime in these regions.

FIG. 4a shows a substrate 310 on which a buffer layer or DTL 320, a collector layer or first layer 330, a base layer or second layer 340 and an emitter layer or third layer 350 have been epitaxially grown on top of each other (or arranged as a stack) using e.g. the technique described above. The direction of epitaxial growth is herein referred to as the vertical direction. FIG. 4b illustrates a step during which the concentration of Carbon (C) is increased, or in other words during which the Carbon vacancy density is reduced, in the base layer 340 and the emitter layer 350, at least at the top of the device but preferably in both layers 340 and 350. As depicted in FIG. 4b, an alternative is to perform an implantation of Carbon (C) atoms in the base layer 340 and the emitter layer 350. Another alternative (not illustrated in the figures) could be to oxidize the surface of the device, i.e. part of the emitter layer 350, during which silicon atoms (from the emitter layer) are consumed, thereby leaving an excess of C at the surface (which may also diffuse further down in the emitter and base regions under the effect of high temperature annealing). An annealing step may also be carried out after C implantation to cause C diffusion into a controlled depth below the surface in order to increase the minority carrier lifetime in both the emitter layer 350 and the base layer 340. FIG. 4c illustrates the step of ion bombardment, resulting in damage in the crystallographic structure of a zone of the collector region 330, and in the present example also a zone of the DTL 320, as represented by the zone denoted 325 in the figure. The damaged crystallographic structure may include defects which, as mentioned above, may correlate with Carbon vacancies, thereby reducing the minority carrier lifetime in such zones. Thanks to the preceding step of Carbon implantation and/or oxidation, the emitter layer and the base layer still have a high minority carrier lifetime, which is advantageous for providing a BJT with high current gain. Ion bombardment may advantageously be performed using ions such as Helium and energies in the range of about 1-5 MeV (megaelectronvolts).

Although not illustrated in the figures, it may also be envisaged to perform ion bombardment at the backside of the device (i.e. the backside of the substrate 310, i.e. the side opposite to the collector layer 330) for reducing the risk of damage in the base layer 340 and the emitter layer 350. This technique may be particularly advantageous in combination with wafer thinning.

Figure 5A:
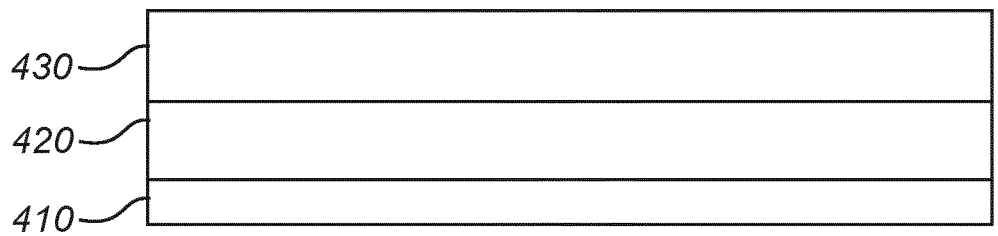
FIGS. 5a-5c illustrate methods of manufacturing a SiC BJT according to other embodiments of the present invention.
Figure 5B:
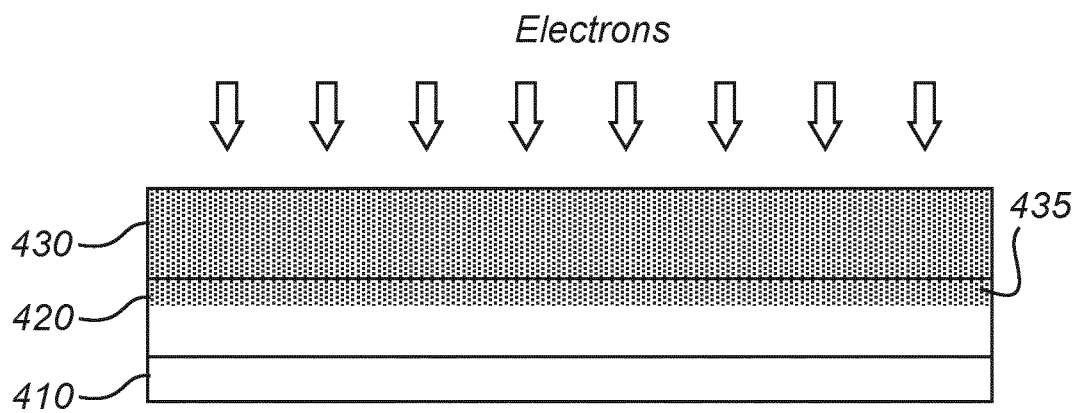
Figure 5C:
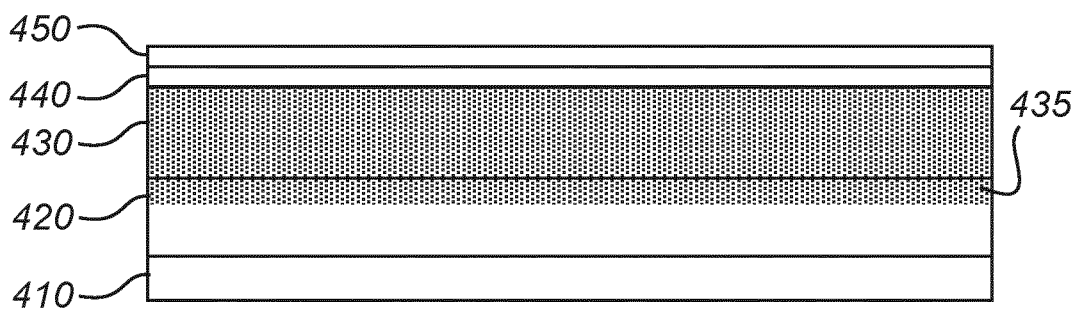

Turning now to FIGS. 5a-5c, a sequence of manufacturing steps for forming a SiC BJT according to another embodiment is described. The present sequence uses electron irradiation to reduce the minority carrier lifetime in at least a zone of the collector layer (and optionally also in the DTL). Although electron irradiation can be performed after epitaxy of the whole BJT structure, i.e. after epitaxy of all the layers, electron irradiation is performed before forming the base layer and the emitter layer in the present embodiment, the advantage being that the emitter layer and the base layer are not affected by electron irradiation. FIG. 5a shows a substrate 410 on which a buffer layer or DTL 420 and a collector layer or first layer 430 have been epitaxially grown using e.g. the technique described above. FIG. 5b illustrates the step of electron irradiation, which may be performed with electron energies in the range of about 1-20 MeV (megaelectronvolts) and more preferably in the range of about 5-15 MeV. The purpose of electron irradiation is to create damage in a zone of the collector region 430 (preferably the entire collector region 430 as shown in FIG. 5b), and optionally also in the DTL 420 as illustrated in FIG. 5b, intended to have a reduced minority carrier lifetime. The electron irradiated zone is denoted 435 in FIG. 5b, covering the collector region 430 and part of the DTL 420. FIG. 5c shows the next steps of epitaxy during which a base layer or second layer 440 and an emitter layer or third layer 450 are grown on top of the collector layer or first layer 430.

It will be appreciated that any combinations of the above described steps may be envisaged depending on the final application and/or the final desired performance of the device. The advantage of performing ion bombardment and/or electron irradiation without affecting the base layer and the emitter layer being that a high minority carrier lifetime can be maintained in these layers, thereby resulting in a high current gain for the SiC BJT. However, on the processing point of view, it may be sometimes preferable not to interrupt the epitaxial growth of the layers.

After electron or ion irradiation, an annealing step may be performed to activate dopants that might have been de-activated by irradiation.

Although not shown in the figures, another embodiment for manufacturing of a SiC BJT with a zone having a reduced minority carrier lifetime in its collector region may be based on the change of parameters (e.g. relationship in gas flow) during epitaxy. The manufacturing method may comprise epitaxial growth of at least a portion of the collector region (or layer) with a first set of growth parameters and epitaxial growth of the base region (or layer) with a second set of growth parameters for obtaining a minority carrier lifetime in the portion of the collector region being shorter than in the base region.

As another example, the collector layer may be formed by a sequence of epitaxial growth of SiC on top of the DTL with a first set of growth parameters for forming a first part of the collector region, epitaxial growth with a second set of growth parameters being different than the first set of growth parameters for forming the zone and epitaxial growth with the first set of growth parameters for forming the remaining part of the collector region and then subsequently the base region and the emitter region.

The advantage of such alternatives is that it does not require any separate processing step for the forming of the zone since the zone with reduced minority carrier lifetime is provided during epitaxy.

Subsequently, any deposit on the back side of the substrate due to the CVD growth process may be removed using plasma etch. A normal manufacturing process may also include patterning and etching of the emitter region or mesa 150, patterning and etching of the base region or mesa 140, and forming the junction termination region 160 at the periphery of the base mesa 140, such as illustrated in FIGS. 1 and 2. Outline of the base mesa 140 may advantageously have sufficiently rounded edges to prevent electric field concentration at its periphery. The junction termination region 160 is intended to prevent the device from electric field concentration at the periphery, thereby preventing early breakdown. The junction termination region 160 may be formed by a number of techniques, such as for example the junction termination extension technique. Further, a ring with an accurately controlled acceptor dose may be formed at the periphery of the base mesa 140 by implantation of boron or aluminum ions into the device periphery, the acceptor dose corresponding to full depletion of the implanted region at approximately 50 to 70% of the theoretical breakdown voltage. The dose may advantageously be in the range of approximately $0.9 \times 10^{13}$ to $1.2 \times 10^{13}$ cm$^{-2}$ for electrically active acceptors in the JTE region.

A highly doped p-type subcontact region 142 may optionally be formed underneath the desired location of ohmic base contacts 145 by selective implantation of Al acceptor ions into the passive base (or passive part of the base). Acceptor ion implants may then be followed by annealing at a high temperature between about 1500° C. and 1700° C. to activate the acceptor ions.

Further manufacturing stages may include the SRS layer formation and the formation of the ohmic contacts 155, 145 and 115 to the emitter region 150, to the base region 140 and to the backside of the substrate 110, respectively. A two-level metal interconnect may preferably be formed to reduce, and preferably minimize, the on-state device resistance, as well as to ensure long-term stability of the contact metallization.

Applications of bipolar junctions transistors disclosed in the present specification may be found in photovoltaic inverters, switched mode power supplies, motor drive systems and drives for hybrid and fully electric vehicles.

Even though the invention has been described with reference to specific exemplifying embodiments thereof, many different alterations, modifications and the like will become apparent for those skilled in the art. The described embodiments are therefore not intended to limit the scope of the invention, as defined by the appended claims.

The invention claimed is:

1. An apparatus, comprising:
   an emitter region, a base region, and a collector region included in a silicon carbide (SiC) bipolar junction transistor, the collector region being arranged on a SiC substrate having an off-axis orientation of 8 degrees or lower;
   a defect termination layer, DTL, for terminating dislocations originating from the substrate, the DTL being arranged between the substrate and the collector region; and
   a zone in which the minority charge carriers have lifetimes shorter than in the base region such that the zone is configured to prevent access of minority charge carriers from the collector region to the DTL, the zone having at least a portion disposed between the base region and the DTL.

2. The apparatus of claim 1, wherein the zone extends laterally at least under a metallurgical junction formed by the base region and the emitter region.

3. The apparatus of claim 1, wherein the zone covers at least 10 percent of a volume of the collector region.

4. The apparatus of claim 1, wherein the zone extends vertically towards the DTL, starting at a distance of 1-4 μm from a metallurgical junction formed by the base region and the collector region.

5. The apparatus of claim 1, wherein the zone is arranged in a lower part of the collector region.

6. The apparatus of claim 1, wherein the zone extends vertically through the whole collector region.

7. The apparatus of claim 1, wherein minority charge carriers in the DTL have lifetimes shorter than in the base region.

8. The apparatus of claim 1, wherein the minority charge carriers have lifetimes in the zone less than 200 nanoseconds.

9. The apparatus of claim 1, wherein the minority charge carrier lifetime in the zone is two times less than in the base region.

10. The apparatus of claim 1, wherein the zone includes at least one of a damaged crystallographic structure, an ion-bombarded zone, or an electron-irradiated zone.

11. The apparatus of claim 1, wherein at least one of the base region or the emitter region have a lower concentration of carbon vacancies than the collector region.

12. The apparatus of claim 1, wherein the substrate has an off-axis orientation of 2-4 degrees.

13. The apparatus of claim 1, wherein the DTL has a thickness in a range of 5-30 micrometers.

14. The apparatus of claim 1, wherein the zone is disposed in the collector region.

15. The apparatus of claim 1, wherein the zone extends into the DTL.

16. The apparatus of claim 1, wherein the apparatus is a bipolar junction transistor (BJT).

17. The apparatus of claim 1, wherein the zone is disposed in proximity to an interface between the collector region and the DTL.

18. A semiconductor device, comprising:
    a first region disposed on a silicon carbide (SiC) substrate, the first region having a first conductivity type;
    a second region disposed on the first region, the second region having a second conductivity type opposite to the first conductivity type;
    a third region disposed on the second region and having the first conductivity type, the first region, the second region, and the third region being included in a SiC bipolar junction transistor;
    a defect termination layer (DTL) disposed between the substrate and the first region for terminating dislocations originating from the substrate; and
    a zone in which minority charge carriers have lifetimes shorter than in the second region such that the zone is configured to prevent access of minority charge carriers from the first region to the DTL, the zone having at least a portion disposed between the second region and the DTL.

19. The semiconductor device of claim 18, wherein the zone extends laterally at least under a metallurgical junction formed by the second region and the third region.

20. The semiconductor device of claim 18, wherein the zone covers at least 10 percent of a volume of the first region.

21. The semiconductor device of claim 18, wherein the zone extends vertically towards the DTL, starting at a distance of 1-4 μm from a metallurgical junction formed by the second region and the first region.

22. The semiconductor device of claim 18, wherein the zone is arranged in a lower part of the first region.

23. The semiconductor device of claim 18, wherein the zone extends vertically through the whole first region.

* * * * *